(12) United States Patent
Schilson

(10) Patent No.: US 6,222,131 B1
(45) Date of Patent: Apr. 24, 2001

(54) FLAT CABLE

(75) Inventor: Tom Schilson, Hamilton, IL (US)

(73) Assignee: Methode Electronics, Inc., Chicago, IL (US)

( * ) Notice: Subject to any disclaimer, the term of this patent is extended or adjusted under 35 U.S.C. 154(b) by 0 days.

(21) Appl. No.: 09/397,396

(22) Filed: Sep. 16, 1999

Related U.S. Application Data

(62) Division of application No. 08/627,136, filed on Apr. 3, 1996, now Pat. No. 6,026,563.

(51) Int. Cl.$^7$ ..................................................... H01B 7/08
(52) U.S. Cl. ..................................................... 174/117 FF
(58) Field of Search .................. 174/117 F, 117 FF, 174/117 A; 439/15, 164

(56) References Cited

U.S. PATENT DOCUMENTS

| | | | |
|---|---|---|---|
| 3,168,617 | 2/1965 | Richter | 174/117 |
| 3,239,916 | * 3/1966 | Love | 174/117 FF X |
| 3,728,183 | 4/1973 | Wasco et al. | 156/73 |
| 3,775,552 | * 11/1973 | Schumacher | 174/117 F X |
| 3,829,602 | 8/1974 | Ishikawa et al. | 174/102 |
| 4,305,988 | 12/1981 | Kocher | 428/158 |
| 4,333,978 | 6/1982 | Kocher | 428/158 |
| 4,400,227 | 8/1983 | Riemersma | 156/73.1 |
| 4,427,485 | 1/1984 | Kutnyak et al. | 156/429 |
| 4,539,442 | 9/1985 | Puls et al. | 179/115.5 |
| 4,659,872 | 4/1987 | Dery et al. | 174/117 |
| 4,696,523 | 9/1987 | Schauer et al. | 439/11 |
| 4,748,293 | 5/1988 | Kikuchi et al. | 174/117 |
| 4,767,492 | 8/1988 | Fukusima et al. | 156/580 |
| 5,134,249 | 7/1992 | Adachi | 174/92 |
| 5,250,127 | * 10/1993 | Hara | 174/117 FF X |
| 5,268,179 | 12/1993 | Rudella | 424/449 |
| 5,475,921 | 12/1995 | Johnston | 29/878 |
| 5,487,667 | 1/1996 | Bolen | 439/164 |
| 5,681,409 | 10/1997 | Lin et al. | 156/73.1 |

* cited by examiner

Primary Examiner—Dean A. Reichard
Assistant Examiner—Chau N. Nguyen
(74) Attorney, Agent, or Firm—Karl D. Kovach; David L. Newman

(57) ABSTRACT

A flat electrical cable is provided wherein the flat cable includes an upper layer having ribs protruding along its length and substantially parallel to one another, continuous substantially parallel and adjacent seams formed between and upper an lower insulator layer conductors between the upper and lower layer adjacent the seams and a pattern formed in the surface of the lower insulator layer. The present invention may have upper and lower polyester layers having copper conductors therebetween and the seams ultrasonically welded in order to provide flat electrical cable for various applications such as incorporation in an automobile clockspring.

4 Claims, 2 Drawing Sheets

FLAT CABLE

This is a division of application Ser. No. 08/627,136 filed Apr. 3, 1996 now U.S. Pat. No. 6,026,563.

BACKGROUND OF THE INVENTION

The present invention pertains to flat cable and a method of making flat cable and, in particular, flat electrical cable with exposed conductors without adhesive residue.

Flat electrical cables are well known in the art having conductors sandwiched between two insulating layers. Flat conductor cable is known in the art having an upper insulator layer having an adhesive adhered to a first side of the upper layer and a lower layer of insulating material having an adhesive adhered to a first side of the lower layer. A conductor or strands of conductors are placed between the upper and lower insulator layers and all three layers are secured together by the adhesive. However, use of adhesive to bond the layers is disadvantageous in that upon heating of the adhesive, the conductors may float in the free flowing adhesive causing the spacing between the conducts to be inconsistent and non-parallel. Upon drying and attempted attachment of the flat cable to a component, the improperly placed conductor may not align with the conductive leads of the component. The cable is to be attached to and the flat cable is unusable and must be discarded. Further, when the cable is stripped to expose the conductors for connection of the cable to a component, the conductors have an adhesive residue thereon which inhibits the conductive properties of the conductor. Also, if any scrap material of the insulator layers is produced, the scrap may not be recycled due to the presence of the adhesive on the insulator layer.

Other bonding techniques are known in the art for bonding multiple layers such as ultrasonic welding. Generally ultrasonic welding has been used for spot welding with thermoplastic materials using a plunge mode. Ultrasonic welding using a continuous weld or a shear mode has only been known for welding metals. Therefore, the known methods of welding thermoplastic materials using ultrasonics did not provide for a continuous welded seam and the seam, therefore, does not have great pull strength. In the area of electrical cables, seams of great pull strength are required and the previously known welding techniques are not sufficient. Therefore, it is an object of the present invention to provide a flat electrical cable which is bonded without use of adhesives and provides for a continuous seam.

It is another object of the invention to provide a method of assembling a flat cable by bonding without using adhesives and to provide a continuous seam.

It is a further object of the present invention to provide a flat cable having exposed conductors without an adhesive residue.

It is another object of the present invention to provide a flat cable which has a pattern on one side of the cable in order to reduce friction of that one side against other surface.

It is a further object of the present invention to provide a method of assembling a flat cable which allows for the recycling of waste materials and provides for a quick and inexpensive method of manufacturing the flat cable.

It is a further object of the present invention to provide a method of manufacturing flat cable which may be tested by a vision system in order to ensure that a per bond has been formed between the insulator layers.

It is another object of the present invention to provide a flat cable which allows for the exposure of the conductors without the use of grinding equipment.

SUMMARY OF THE INVENTION

A principal object of this invention is to provide a flat electrical cable comprising an upper insulator layer, a lower insulator layer connected to the upper layer, a lower insulator layer connected to the upper layer along continuous parallel spaced-apart seams and an intermediate layer comprised of individual strands of conductors which lie adjacent and parallel to the seams and the conductors do not have an adhesive residue thereon. The upper layer may include a plurality of raised surfaces running parallel to each other along the length of the flat cable. The lower layer may be substantially planar and include a pattern formed on the majority of the surface of the lower layer. The upper and lower insulator layers may be polyester. The conductors may be copper. The seams may be ultrasonically welded. The conductors may be exposed at an end portion of the flat cable beyond the upper and lower insulator layers. The cable may include a continuous seam except for a nonbonded area where the upper and lower insulator layers are not connected. The cable may include a continuous seam except for a nonbonded area where the upper and lower insulator layers include windows that expose the conductors.

In another embodiment of the invention, a flat electrical cable is provided comprising an upper layer of polyester having a ribbed surface, a lower layer of polyester connected to the upper layer along continuous parallel spaced-apart ultrasonically bonded seams and individual strands of copper conductors lying substantially parallel and adjacent to the seams between the upper and lower layers. The lower layer may have a pattern along the majority of its exposed surface.

In another embodiment of the invention, a clocking is provided for electrically connecting an airbag in a steering wheel of a vehicle through a steering column to crash sensors, the clockspring comprising a housing having an inner chamber and a flat electrical cable including an per insulator layer, a lower insulator layer connected to the upper layer along continuous parallel spaced-apart seams and an intermediate layer comprised of individual strands of conductors which lie adjacent and parallel to the seams and the conductors do not have an adhesive residue thereon, the flat electrical cable being mounted in the chamber of the clockspring.

A method of assembling a flat electrical cable is provided comprising the steps of feeding an upper and lower layer of insulator material and an intermediate layer of conductors simultaneously between a rotary horn and a rotary anvil, wherein the rotary horn operates via a shear mode and ultrasonically bonding the upper and lower layers together along a seam substantially parallel and adjacent the conductors. The rotary horn may be a full horn. The rotary anvil may include a series of grooves and protrusions corresponding to the arrangement of the conductors oriented between the insulator layers wherein the insulator layers are compressed between the protruding portion and a weld surface of the rotary horn in order to form the seams. The insulator layers may be a polyester material and the conductors copper. The rotary horn may include a weld surface having a pattern. The rotary anvil may be formed in order that the insulator material is not ultrasonically welded to the conductors. The method may include the additional steps of periodically stopping the ultrasonic welding operation to provide for nonbonded portions of the flat electrical cable. The method may further include the steps of cutting the flat cable into individual lengths and stripping the ends of the cable. The stripping of the end of the cable may be accomplished by inserting the end into a rotary grinding machine to remove the upper and lower insulator layers to expose a width of the conductors and removing the excess end portion of the cable to leave the conductors protruding beyond the insulator layers. The stripping of the end of the cable may occur by removing the upper and lower insulator layers to leave the conductors exposed and protruding beyond the end of the flat cable. The method of assembling the flat electrical cable may include the step of testing the assembled cable for the presence of bonded seams.

A further method of assembling a flat electrical cable includes the steps of pulling strands of conductors off of reels, wiping the individual strands of conductors, separating the strands of conductors, straightening the strands of conductors, guiding the conductors to the bonding area, pulling an upper and lower layer of insulator material to the bonding area, simultaneously inserting the upper and lower insulator layers and intermediate thereto the strands of conductors between a rotary horn and a rotary anvil, ultrasonically bonding the upper and lower layers and forming seams substantially parallel and adjacent the conductors, slitting the lengths of the flat cable, and taking up the completed flat electrical cable assembly onto reels.

These and other features of the invention are set forth below in the following detailed description of the presently preferred embodiments.

DETAILED DESCRIPTION OF THE
PRESENTLY PREFERRED EMBODIMENTS

Figure 1:
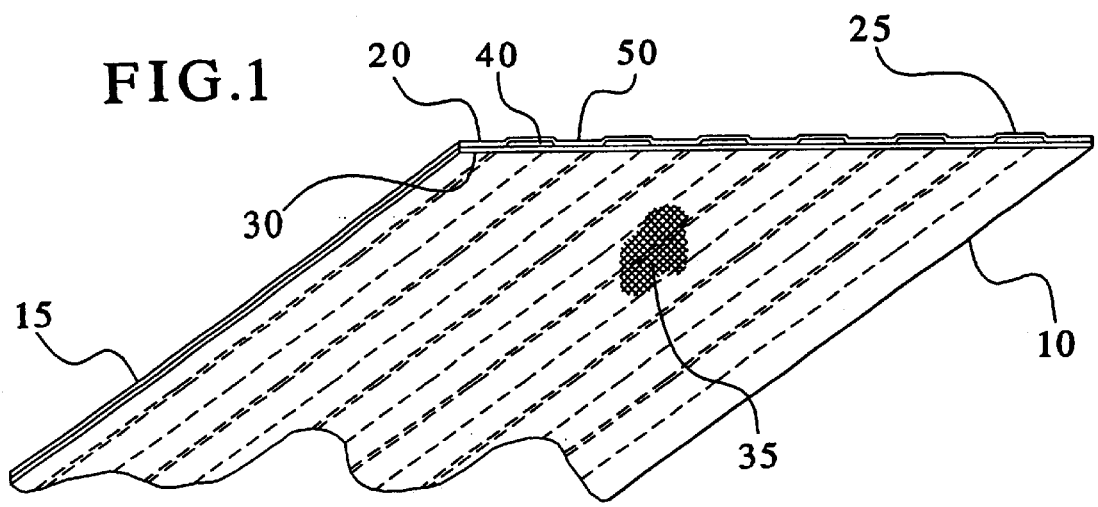
FIG. 1 is a perspective view of the flat cable of the present invention.

The apparatus of the present invention is best understood with reference to FIG. 1 which shows a finished flat conductor cable 10 of a preferred embodiment of the present invention. The flat cable 10 has an upper layer 20 and a lower layer 30 formed of an insulating material. In a preferred embodiment, polyester insulator is used, such as that having a thickness of 0.001 inches. However, thicker insulator materials may be used to provide stronger bonds, such as where the seams are narrow. Intermediate the upper and lower layers 20,30 are conductors 40. The conductors 40 are made of individual strands of metallic material which lie substantially parallel to one and another along the length of the cable 10. In a preferred embodiment, the conductors are formed of annealed copper having a dead soft hardness rating. However, any other conductor may be used such as copper clad steel. The conductors 40 are separated by seams 50. The seams 50 are formed by the continuous bonding between the upper layer 20 and the lower insulator layer 30. A plurality of parallel spaced-apart seams 50 run continuously along the length of the cable 10. In a preferred embodiment, the spacing between the plurality of conductors 40 comprises the seams 50. In other words, the width of each seam 50 approximately equals the space between the adjacent conductors 40. In such a construction, the conductors 40 are trapped in a pocket or encapsulated between the seams 50 and the upper and lower insulator layers 20,30 to avoid any shorting between the parallel strands of conductors 40. In a preferred embodiment, the seams 50 are ultrasonically bonded, which will be discussed further below.

The cable 10 includes a raised surface 25 or ribs above the conductors 40 on the upper layer 20 of the insulator. The raised surface 25 provides for a ribbed texture along the upper surface 20 of the cable 10 and reduces the surface area of the upper layer 20 so that less friction is created when the upper layer 20 rubs against another surface. In an embodiment where the flat cable 10 is wound in a spool, the noise of the surface of the upper layer 20 of the flat cable 10 rubbing against the lower layer 30 will be reduced due to the ribs 25. In addition, in a preferred embodiment, the lower layer 30 of the flat cable 10 has a pattern 35 adhered thereto. Also to reduce the surface area of the most extraneous portions of the lower layer 30 in order to further reduce friction and noise of the lower layer 30 rubbing against another surface.

In the preferred method of assembling the flat cable 10, the bonding of the upper and lower layers 20,30 occurs only at the plurality of seams 50 and no bonding of the upper layer 20 or lower layer 30 occurs to the conductors 40. In such an arrangement, the conductors 40 are bounded on each side by the seams 50 but are loose in the compartment formed by the upper and lower layers 20,30 which are not bonded in the area along the length of the conductor 40. This arrangement provides an advantage in that when the end of the cable 10 is stripped and the conductors 40 are exposed, the exposure operation is simplified in that there is no bonding between the conductors 40 and the upper or lower layers 20,30. Therefore, there is no residue on the conductors 40 and cleaning of the conductors is not required in order to provide the desired level of conductivity. An edge 15 of the flat cable 10 is also bonded and has a continuous seam such as provided by an ultrasonic weld. This edge 15 may be provided by cutting the flat cable 10 via slitting station 89 shown in FIG. 4.

In the preferred embodiment, the seam 50 is continuous and runs along the entire length of the cable 10. The preferred use of the flat electrical cable 10 of the present invention is in an automobile clockspring which provides for the electrical connection of the airbag of an automobile steering wheel rough the steering column to crash sensors in the automobile. In such clocksprings, the flat ribbon cable is wound around an inner chamber of the clockspring housing and generally has a length of approximately two feet. In the process described below, the flat cable is formed continuously in spools of over one-thousand feet. The spool of cable is later cut to two feet lengths and the ends of the two feet lengths are stripped. In the preferred embodiment of the invention, the overall length of the seams will be equal to the length of the entire spool of cable, as the seams 50 are continuous. In an alternate embodiment, the seam may be noncontinuous at the separation areas of the cable 10. Thus, the majority of the length of the cable 10 has a continuous seam 50 except at the end of that portion of the cable having a desired length to be used and attached to a component. For example, at two feet intervals along the length of the cable 10 a narrow nonbonded separation area may be formed. The nonbonded areas are located at the point along the cable where it is intended that the flat cable will be cut or separated. A nonbonded area will be formed every two feet of the cable so that the end portions of the two foot lengths of the flat cable 10 will have small areas, for example, one inch lengths, which are nonbonded. In this way, the ends of the cable may be easily processed in order to expose the conductors 50. Having the nonbonded areas allows for the top and bottom layers to easily be clipped or cut to expose the conductors 40. In the previously mentioned embodiment having completely continuous seams, the desired lengths of the flat cable must be inserted in a grinding machine in order to remove the layers of insulation and expose the conductors or cut the insulator layers from between the conductors. The method of forming the nonbonded areas at specific intervals along cable will be discussed further below.

An alternate embodiment of the present invention may be provided having multiple layers of insulating material and conductors therebetween. Additional layers may include ground wires or a ground plane or a drain wire or additional layers to limit cross talk.

Figure 2:
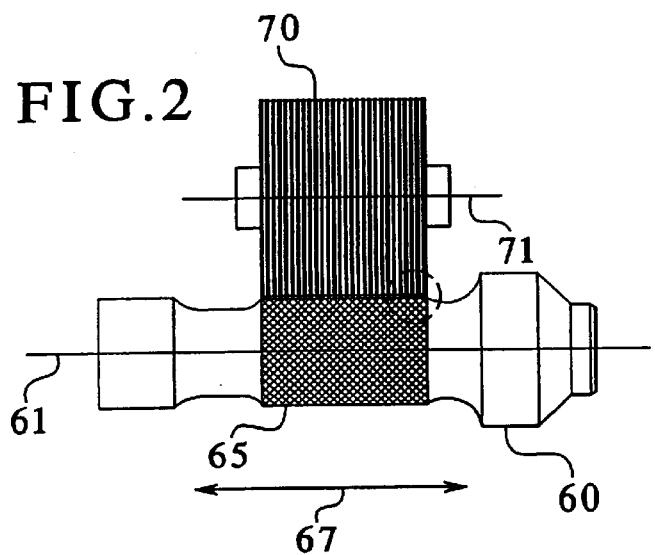
FIG. 2 is a side-elevation view of the preferred apparatus for bonding of the flat cable.
Figure 3:
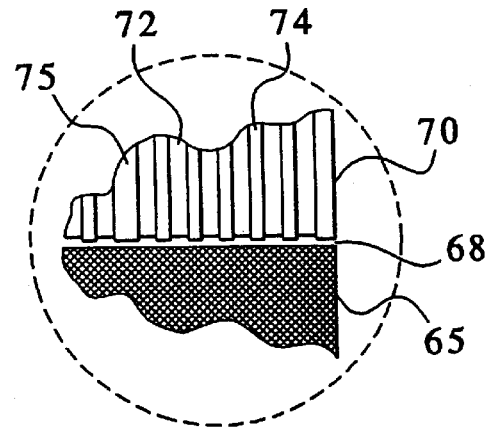
FIG. 3 is an enlarged view of the bonding area of FIG. 2.
Figure 4:
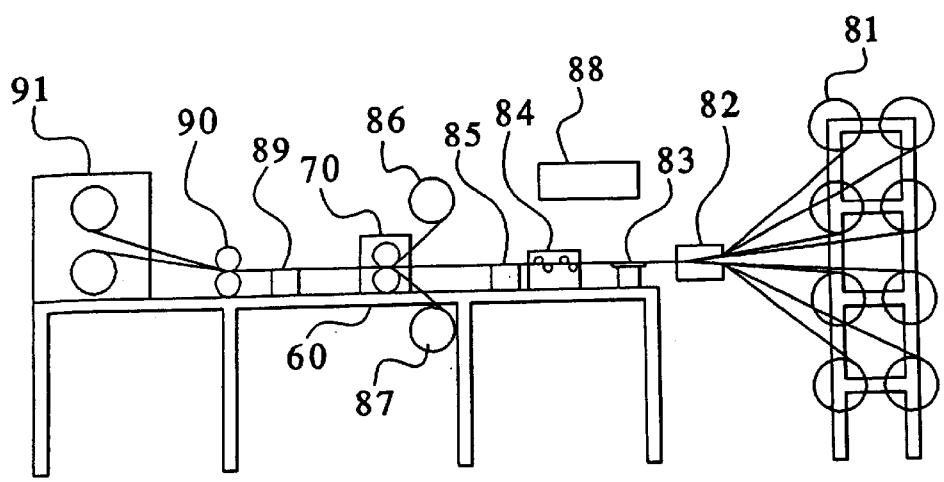
FIG. 4 is a side-elevation view of the assembly machinery and process of the present invention.

The method of assembling the flat cable of the present invention is best understood with reference to FIGS. 2–4. The specific bonding process of the preferred embodiment of the present invention will be discussed with reference to FIGS. 2 and 3 and the overall process with reference to FIG. 4. Turning to FIG. 2, a rotary horn 60 is shown having weld surface 65. Adjacent the rotary horn 60 is rotary anvil 70. The rotary anvil 70 rotates about axis 71 and rotary horn 60 rotates about axis 61. The rotary horn 60 provides for the ultrasonic bonding of the flat cable which is inserted between the rotary horn 60 and the rotary anvil 70. In a preferred embodiment, a full wave rotating horn of titanium is used in order to provide for a weld surface 65 of greater than one inch. In a preferred embodiment, the weld surface 65 is three inches wide. The three inch wide weld surface 65 is preferred so that the maximum footage of flat cable 10 may be produced. Although in the preferred embodiment of the end use of the cable 10 widths are approximately one-half inch, the three inches wide weld surface 65 allows for the simultaneous assembly of six cables side-by-side, to be separated later. The three inch weld surface 65 provides for the maximum width without sacrificing a uniform amplitude level of the rotary horn 60 so that the ultrasonic bond strength is maintained. In a preferred embodiment, the full wave horn 60 provides for ultrasonic bonding via a shear mode or in the horizontal direction of arrow 67. The use of the full wave horn having a shear mode provides for continuous welding to form a continuous seam 50 of the flat cable 10. As is known in the ultrasonic bonding art, the rotary horn 60 is attached to a converter and a booster which generates a voltage which creates a wave which passes though the rotary horn 60 and causes the rotary horn 60 to oscillate or vibrate in the direction of arrow 67. In a preferred embodiment, the horn will vibrate at approximately 20 kHz.

Turning to FIG. 3, an enlarged view of the FIG. 2 shows the bonding area between the weld surface 65 of the rotary horn 60 and the rotary anvil 70. The rotary anvil 70 includes a plurality of copper locating grooves 72 and inserted between the grooves 72 are protrusions 74. The flat cable is fed between the weld surface 65 of the rotary horn 60 and the rotary anvil 70 at gap 68 so that the upper insulator layer 20 is adjacent the rotary anvil 70 and the lower layer 30 is adjacent the rotary horn 60. The grooves 72 and protrusions 74 of the rotary anvil 70 are designed and oriented according to the specific arrangement and spacing of conductors desired in the flat cable. In the embodiment shown in FIG. 3, the rotary anvil 70 has been designed to form a flat cable having six conductors as can be seen by the group of six grooves 72. The rotary horn 70 is designed so that a batch of flat cables are formed simultaneously side-by-side which may be separated later during the assembly process. The broad protrusion 75 provides for a broad space in order to allow for the separation of individual flat cables. In a preferred embodiment, the anvil and weld surface 65 of the rotary horn 60 are designed to make six individual cables simultaneously side-by-side, each having six conductors. In the preferred embodiment, the entire bonding surface between the weld surface 65 of the rotary horn and the rotary anvil 70 is three inches wide. Each individual flat cable is approximately half of an inch wide and therefore, six individual cables can be formed simultaneously and later split in order to form the individual flat cables. Therefore, in the preferred embodiment, the rotary anvil 70 will have five wide protrusion areas 75 in order to form six separate areas having six grooves 72 to form each individual flat cable having six conductors therein. The grooves 72 have a width just slightly larger than the width of the conductors being bonded within the flat cable. In the preferred embodiment, the width of the grooves 72 is 0.045 inches. The pacing of the conductor is determined by the width of the protrusion 74. In the preferred embodiment, the protons 74 all have the same width of approximately 0.0338 inches. However, all these dimensions may vary dependent on the overall design and requirements of cable desired. In a preferred embodiment, the rotary anvil 70 may be interchangeable with other rotary anvils having different spacing of the grooves 72 and protrusions 74 to assemble a flat cable having differently spaced conductors.

The upper and lower insulator layers having conductors arranged in between and spaced corresponding to the spacing of the protrusions 74 of the rotary anvil 70 are fed between the rotary anvil 70 and the rotary horn 60 where bonding of the assembly will occur. The height of the gap 68 between the protrusions 74 and the weld surface 65 is slightly less than the combined height of the two layers of the insulator. Therefore, upon insertion of the upper and lower insulator layers between the weld surface 65 of the rotary horn and the rotary anvil 70, the insulator layers are compressed between the protrusions 74 and the weld surface 65. The conductors 40 of the flat cable 10 are spaced correspondingly to the grooves 72. The conductors 40 fill the space in each groove 72 above the weld surface 65. The grooves 72 have a predetermined depth in order to avoid the welding of the conductors to the upper and lower insulator layers 20,30. As the depth of the grooves 72 increases, the amount of tension placed on the lower layer 30 of the flat cable against the weld surface 65 is reduced so that welding does not occur between the conductor and the insulator layers 20,30. In a preferred embodiment, the grooves 72 have a depth of 0.004 inches.

In a preferred embodiment, the insulator layers 20,30 and conductors 40 are fed through the gap 68 at a speed of approximately 4 inches per second. The vibrating rotary horn 60 creates a frictional heat at the weld surface 65. Bonding occurs at the points where the protrusions 74 compress the insulator layers against the active weld surface 65. The compressive force between the protrusion 74 and the weld surface 65 cause the bonding between the upper and lower insulator layers to occur only at this interface. The protrusions 74 also provide for the shape of upper insulation layer 20 of the flat cable 10. The grooves 72 form the raised area 25 of the flat cable and the protrusions 74 form the depressed seams 50. Further the weld surface 65 of the rotary horn includes a pattern which is burned into the lower layer 30 of the insulator. In a preferred embodiment, the pattern on the weld surface 65 is 90° Knurl.

It can thus be understood that there is no bond between the upper and lower insulators at the groove area 72 in which the conductor is located. Therefore, upon the process of exposing the conductors in order to provide for attachment of the flat cable to a component, the conductors may be easily exposed because there is no insulator material adhered to the conductors. Further, it can be understood that the present invention overcomes the prior art in that there is no adhesive bonded to the conductors in that the bonding of the present invention only occurs at the predetermined areas where the protrusions 74 are located.

Turning to FIG. 4, the overall method of assembly of the flat cable may be understood. The operation starts on the right side where multiple conductor reels 81 are mounted. In a preferred embodiment, copper is used as conductors and these copper reels are purchased from Torpedo Wire Company (Pittsfield, Pa.). The conductors are pulled off of the conductor reels 81 and fed through the wiping area 82 in order to bring the conductors to the same plane and to clean the metallic conductors and remove any residue which might reduce conductivity. The conductors are then fed through the wire separation module 83. The conductor wires are then fed through the conductor straightening module 84 which is a series of grooved rollers that align the conductors. The conductors are then aligned in their final orientation by the conductor guide 85. The conductor guide 85 includes grooves which are spaced corresponding to the grooves 72 of the rotary anvil 70. Because the present method does not use adhesives and such liquid adhesives are not present on the inner layers, the conductors remain positioned on the insulator layers according to the conductor guide 85. Further, the grooves 72 on the rotary anvil 70 also act to maintain the spacing of the conductors 40. The upper insulator reel 86 and lower insulator reel 87 include tension control means and are fed along with the conductor wires between the rotary horn 60 and the rotary anvil 70. The rotary anvil 70 includes guides along its edges in order to align the upper and lower insulator materials and the array of conductor wires. In a preferred embodiment, the upper and lower insulator materials are a clear polyester purchased from Plastic Suppliers, Inc. (Chicago Heights, Ill.).

The rotary horn 60 is controlled by the sonic controller and power supply 88. In a preferred embodiment, the power supply is an Amtech 920 MA advanced high frequency constant amplitude power supply providing a 20 KHz at 2,000 watts (Amtech, Inc., Milford, Conn.). In a preferred embodiment, the controller includes a speed control in order to increase and decrease the speed of the assembly process. The power supply would also include an encoder in order to reduce the power when the process is slowed. When the various reels feeding the process need to be exchanged, it is desirable to slow down the process so that the reels may be changed more easily. The encoder and speed control features are coordinated in order to allow for this process. In an alternate embodiment, the controller will include a continuous mode adjustment which allows for the bonding to occur in a continuous mode or a noncontinuous mode and set the intervals at which the bonding will occur. As discussed above, it may be desirable to provide for nonbonded areas at the ends of the desired lengths of the flat cable where it will be separated. The continuous mode feature will provide for the "off" function of the ultrasonic welding for a preprogrammed amount of time so that a specific distance of the flat cable may have a nonbonded area and the automatic switching of the ultrasonic bonding back to an "on" position in which the continuous bonding is resumed. The controller in a preferred embodiment also includes an amplitude adjustment in order to vary the amplitude in order to control the bonding quality of the rotary horn. In a further alternative method of forming flat cable, insulator layers having windows at predetermined intervals may provide pre-stripped areas in which the conductors are exposed even during bonding.

Adjacent the rotary horn 60 is a cooling mechanism in order to cool the weld surface 65 of the horn 60. Also adjacent the bonding area may be a means of testing the presence and quality of the bond at the seams 50. In a preferred embodiment, a vision system may be used to test the seams 50. As the polyester used as insulators in the preferred embodiment is clear and the rotary horn includes a pattern, the bonded seams are not clear. Thus, a vision system may be programmed to test the clarity of the patterned bonded seams 50 of the successfully welded flat cable 10. If the cable is not bonded, the seams will remain clear and light will pass through the seam 50 without distortion and the bond testing means may be programmed to shut down the assembly process. Such a system may also be programmed to test and record the bonded and nonbonded areas as discussed above in an alternate embodiment.

The bonded flat cable is then pulled through cable splitter 89 in order to split the full widths of the cable into the desired widths of the subgroups of usable flat cable. As discussed above, in a preferred embodiment, the flat ribbon cable is bonded in three inch wide segments and then separated into six, half inch wide cables having six conductors each. The individually spliced flat cables then move through puller rollers 90. The puller rollers 90 pull the insulator layers and the conductor wires through the entire assembly process. Finally, the individual flat cables are received by take-up reels 91. The reels with the flat ribbon cable may then be transported to the specific areas where the flat ribbon cable is to be used and the flat ribbon cable would be cut to the desired lengths and have the ends processed in order to expose the conductors for attachment to a component such as a clockspring. In an alternate embodiment, the assembly process may have incorporated into it the cutting of the flat cable to the desired length and the process for exposing the conductors.

The stripping process may include the insertion of the end of then flat cable between a rotary grinding machine in order grind off the upper and lower insulator layers to leave the conductors exposed. The excess area beyond the exposed conductors may then be trimmed so that bare exposed conductors protrude from the end of the flat cable so that they may be mounted to a component such as an electrical connector and soldered thereto. In an alternate method of stripping the cable ends, a plurality of spaced, adjacent knife blades may penetrate the insulator layers and pull the insulator layer from between and off of the conductors. The present invention provides for the flat cable having the conductors mounted between the insulator layers but not bonded to the insulator layers which provides for an easier stripping process. Because the conductors are not bonded to the insulator layers, the layers of insulation may more easily be stripped and removed from the surface of the conductors. Therefore, after the stripping process, the flat cable is left having protruding conductors without any adhesive residue. Further, in a preferred embodiment, the stripped conductors do not have any insulator residue either. Thus, it can be understood that the present invention provides for a flat cable having exposed conductors which do not have any residue which may inhibit the conductivity of the conductors and provide for a clean surface for the attachment of the conductors to a metallic surface and to allow for a successful soldering process where desired.

Figure 5:
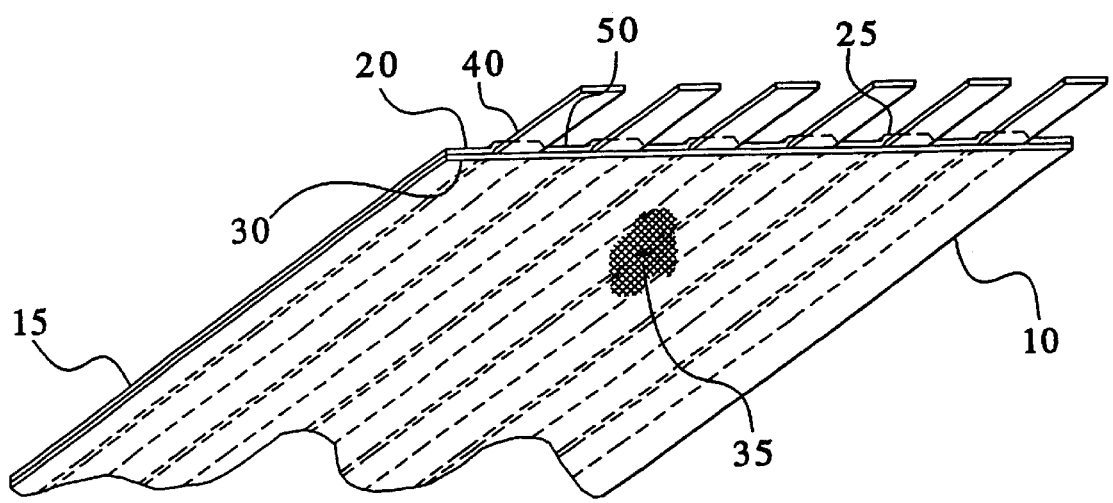
FIG. 5 is a perspective view of an alternate embodiment of the invention of the flat electrical cable after the end portion has been stripped to expose the conductors.

FIG. 5 is an alternate embodiment of the present invention showing the flat electrical cable 10 after the end portion has been stripped to expose the conductors 40. The flat cable 10 shown in FIG. 1 discloses the cable 10 in its condition after the bonding procedure discussed above. The cable 10 after the bonding procedure has the conductors enclosed within the upper and lower insulator layers 20,30. In order to use the flat cable 10 and enable it to be attached to a component, the conductors 40 must be exposed. As discussed above, the conductors may be exposed by stripping the cable to remove the upper and lower insulator layers at an end portion of the cable. As discussed above, procedures such as grinding or cutting the insulator layers with a knife may be used, in addition to the above procedure providing for nonbonded areas. FIG. 5 shows the flat cable 10 after a stripping procedure has been applied to the cable having the array of conductors 40 exposed at the end portion. The conductors 40 protrude from between the upper and lower layers 20,30 of the insulator and are surrounded on the upper side of the conductor 40 by the rib 25 of the upper layer 20 and having seams 50 on each side of the conductor 40. According to the advantages disclosed in the above invention, the conductors 40 do not have any adhesive residue thereon. After stripping of the end of the cable 10, no further procedure such as a cleaning of the conductors is necessary. Due to the bonding method discussed above, without use of adhesives, the conductors are clean and do not have residue which inhibits the conductivity of the metallic material. Following the stripping procedure and the exposure of the conductors 40 as shown in FIG. 5, the flat cable may then be attached to a component by soldering the array of conductors to a connector or inserting the conductors into an electrical connector. Thus, it may be understood according to the above description that the present invention provides for a cable 10 which may be manufactured quickly and easily and provide for a cost savings as well as providing for a finished cable which may be more easily stripped and attached to a component.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A clockspring comprising:
   a housing having an inner chamber; and
   a flat electrical cable being mounted in the chamber of the clockspring, the flat electrical cable including:
   an upper insulator layer,
   a lower insulator layer connected only to the upper insulator layer along substantially continuous parallel spaced apart seams, and
   an intermediate layer comprised of individual strands of conductors which lie adjacent and substantially parallel to the seams, and the conductors do not have an adhesive residue thereon, and wherein
   a first conductor of the conductors is bound by a compartment formed by the upper insulator layer, the lower insulator layer, a first seam of the seams, and a second seam of the seams, and wherein
   the first conductor lies loose in the compartment, and wherein
   the first conductor has a rectangular cross-sectional shape, and wherein
   a second conductor of the conductors has a rectangular cross-sectional shape.

2. A flat electrical cable comprising:
   an upper insulator layer;
   a lower insulator layer connected only to the upper insulator layer along substantially continuous parallel spaced apart seams; and
   an intermediate layer comprised of individual strands of conductors which lie adjacent and substantially parallel to the seams, and the conductors do not have an adhesive residue thereon, and wherein
   a first conductor of the conductors is bound by a compartment formed by the upper insulator layer, the lower insulator layer, a first seam of the seams, and a second seam of the seams, and wherein
   the first conductor lies loose in the compartment, and wherein
   the first conductor has a rectangular cross-sectional shape, and wherein
   a second conductor of the conductors has a rectangular cross-sectional shape.

3. The flat electrical cable of claim 2 wherein the first seam is ultrasonically welded, and wherein the second seam is ultrasonically welded.

4. The flat electrical cable of claim 3 wherein, when end portions of the upper insulator layer and the lower insulator layer are stripped from the first conductor, the end portions of the upper insulator layer and the lower insulator layer are easily removed from the first conductor so as to expose the first conductor.

* * * * *